United States Patent
Lee et al.

(10) Patent No.: US 8,018,143 B2
(45) Date of Patent: Sep. 13, 2011

(54) ORGANIC ELECTROLUMINESCENT DISPLAY DEVICE AND METHOD OF MANUFACTURING THE SAME

(75) Inventors: Byoung-June Lee, Gimcheon-si (KR); Jung-Han Park, Gimhae-si (KR); Hyun-Taek Lim, Busan (KR); Won-Hee Choi, Seoul (KR); Hye-Young Choi, Seokgwan2-dong (KR)

(73) Assignee: LG Display Co., Ltd., Seoul (KR)

( * ) Notice: Subject to any disclaimer, the term of this patent is extended or adjusted under 35 U.S.C. 154(b) by 342 days.

(21) Appl. No.: 12/333,129

(22) Filed: Dec. 11, 2008

(65) Prior Publication Data
US 2010/0001633 A1     Jan. 7, 2010

(30) Foreign Application Priority Data
Jul. 3, 2008   (KR) .................. 10-2008-0064455

(51) Int. Cl.
*H01L 51/50* (2006.01)
(52) U.S. Cl. .................. 313/504; 313/512; 428/690
(58) Field of Classification Search .................. 313/504, 313/506, 512; 445/24, 25; 428/690
See application file for complete search history.

(56) References Cited

U.S. PATENT DOCUMENTS

| | | | | | |
|---|---|---|---|---|---|
| 5,294,870 | A | * | 3/1994 | Tang et al. | 313/504 |
| 6,762,554 | B2 | * | 7/2004 | Jou et al. | 313/512 |
| 2004/0046496 | A1 | * | 3/2004 | Mishima | 313/504 |
| 2007/0132374 | A1 | * | 6/2007 | Park | 313/504 |

* cited by examiner

*Primary Examiner* — Nimeshkumar D Patel
*Assistant Examiner* — Mary Ellen Bowman
(74) *Attorney, Agent, or Firm* — Brinks Hofer Gilson & Lione

(57) ABSTRACT

A method of manufacturing an organic electroluminescent display device includes forming a first electrode on a first substrate including a plurality of pixel regions; forming a patterned spacer on the first electrode in the pixel region; forming an organic light emitting layer on the first electrode in the pixel region and on the patterned spacer; forming a second electrode on the organic light emitting layer; forming a calcium oxide layer on the second electrode; forming a moisture-absorbing layer on the calcium oxide layer; forming a driving thin film transistor on a second substrate; and forming a connection electrode connected to the driving thin film transistor, the connection electrode contacting the second electrode on the patterned spacer.

20 Claims, 6 Drawing Sheets

ORGANIC ELECTROLUMINESCENT DISPLAY DEVICE AND METHOD OF MANUFACTURING THE SAME

RELATED APPLICATIONS

The present invention claims the benefit of Korean Patent Application No. 2008-0064455, filed in Korea on Jul. 3, 2008, which is hereby incorporated by reference for all purposes as if fully set forth herein.

BACKGROUND

1. Field of the Invention

The present invention relates to an organic electroluminescent display device, and more particularly, an organic electroluminescent display device and a method of manufacturing the same.

2. Discussion of the Related Art

In general, display devices include cathode-ray tubes (CRT) and various types of flat panel displays. However, the various types of flat panel displays, such as liquid crystal display (LCD) devices, plasma display panel (PDP) devices, field emission display (FED) devices, and electroluminescent display (ELD) devices, are currently being developed as substitutes for the CRT. For example, advantages of LCD devices include a thin profile and low power consumption. However, LCD devices require a backlight unit because they are non-luminescent display devices. Organic electroluminescent display (OELD) devices, however, are self-luminescent display devices. OELD devices operate at low voltages and have a thin profile. Further, the OELD devices have fast response time, high brightness, and wide viewing angles.

FIG. 1 is a circuit diagram illustrating an OELD device according to the related art.

Referring to FIG. 1, the OELD device includes gate and data lines GL and DL crossing each other to define a pixel region P. In the pixel region P, a switching thin film transistor STr, a storage capacitor StgC, a driving thin film transistor DTr and an organic light emitting diode E.

Gate and source electrodes of the switching thin film transistor STr are connected to the gate and data lines GL and DL, respectively. One electrode of the storage capacitor StgC is connected to a drain electrode of the switching thin film transistor STr and a gate electrode of the driving thin film transistor DTr, and the other electrode of the storage capacitor StgC is connected to a source electrode of the driving thin film transistor DTr and a power line PL. The drain electrode of the driving thin film transistor DTr is connected to an anode of the organic light emitting diode E. The cathode of the organic light emitting diode E is grounded.

A gate signal is applied to the gate line GL, and the switching thin film transistor STr is turned on. A data signal is applied to the data line DL, passes through the switching thin film transistor STr, stored in the storage capacitor StgC and applied to the gate electrode of the driving thin film transistor DTr. A current flowing the driving thin film transistor DTr is determined according to the data signal applied to the driving thin film transistor DTr, and the organic light emitting diode E emits light according to the current.

The organic light emitting diode E is generally formed at the substrate where the transistors STr and DTr are formed. Alternatively, the organic light emitting diode E is formed at a substrate different from the substrate where the transistors STr and DTr, and this type OELD device is referred to as a dual panel type OELD device.

FIG. 2 is a cross-sectional view illustrating a dual panel type OELD device according to the related art.

Referring to FIG. 2, a gate line (not shown) and a data line 15 are formed on a first substrate 10 and cross each other to define a pixel region P. In the pixel region P, a switching thin film transistor (not shown) and a driving thin film transistor Tr are formed. A passivation layer 25 is formed on the driving thin film transistor Tr and has a contact hole 27 exposing a drain electrode 20 of the driving thin film transistor Tr. A patterned spacer 30 is formed on the passivation layer 25. A connection electrode 35 is formed on the patterned spacer 30 and contacts the drain electrode 20 through the contact hole 27.

A first electrode 53 is formed on a second substrate 50. A buffer pattern 57 is formed on the first electrode 53 in a peripheral region of the pixel region P. A separator is formed on the buffer pattern 57 and has a trapezoidal shape. An organic light emitting layer 65 and a second electrode 70 are formed on the first electrode 53 in the pixel region P. An organic light emitting diode includes the first electrode 53, the organic light emitting layer 65 and the second electrode 70.

The OELD device 1 includes a moisture absorbent to remove a moisture permeating into the OELD device 1. The moisture absorbent is formed along a seal pattern attaching the first and second substrates 10 and 50. Alternatively, the second electrode 70 includes an aluminum layer and a calcium layer, and the calcium layer functions as the moisture absorbent. However, the calcium layer diffuses into the aluminum layer and its moisture-absorbing function is reduced. Accordingly, the organic light emitting layer 65 is deteriorated and life time of the OELD device 1 is thus reduced.

FIG. 3 is a cross-sectional view illustrating the related art OELD device where an foreign substance exists.

Referring to FIG. 3, since adhesion of a calcium layer 70b and a aluminum layer 70a is poor, the calcium layer 70b comes off the aluminum layer 70a or a second electrode 70 comes off an organic light emitting layer 65. Further, due to indraft of an alien substance 90 in a process of forming the organic light emitting layer 65, short-circuit between the first and second electrodes 53 and 70 is caused. In other words, when the organic light emitting layer 65 is formed, the indraft of the alien substance 90 is caused and the organic light emitting layer 65 is thus not formed around the alien substance 90. Accordingly, the second electrode 70 on the organic light emitting layer 65 intrudes into a portion, where the organic light emitting layer 65 is not formed, and finally contacts the first electrode 53, and thus the short-circuit is caused. The pixel region P, where the short-circuit occurs, is always in a white or black state. Accordingly, display quality and production efficiency is reduced.

BRIEF SUMMARY

A method of manufacturing an organic electroluminescent display device includes forming a first electrode on a first substrate including a plurality of pixel regions; forming a patterned spacer on the first electrode in the pixel region; forming an organic light emitting layer on the first electrode in the pixel region and on the patterned spacer; forming a second electrode on the organic light emitting layer; forming a calcium oxide layer on the second electrode; forming a moisture-absorbing layer on the calcium oxide layer; forming a driving thin film transistor on a second substrate; and forming a connection electrode connected to the driving thin film transistor, the connection electrode contacting the second electrode on the patterned spacer.

In another aspect, an organic electroluminescent display device includes a first electrode on a first substrate including a plurality of pixel regions; a patterned spacer on the first electrode in the pixel region; an organic light emitting layer on the first electrode in the pixel region and on the patterned spacer; a second electrode on the organic light emitting layer; a calcium oxide layer on the second electrode; a moisture-absorbing layer on the calcium oxide layer; a driving thin film transistor on a second substrate; and a connection electrode connected to the driving thin film transistor, the connection electrode contacting the second electrode on the patterned spacer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Reference will now be made in detail to illustrated embodiments of the present invention, which are illustrated in the accompanying drawings.

Figure 1:
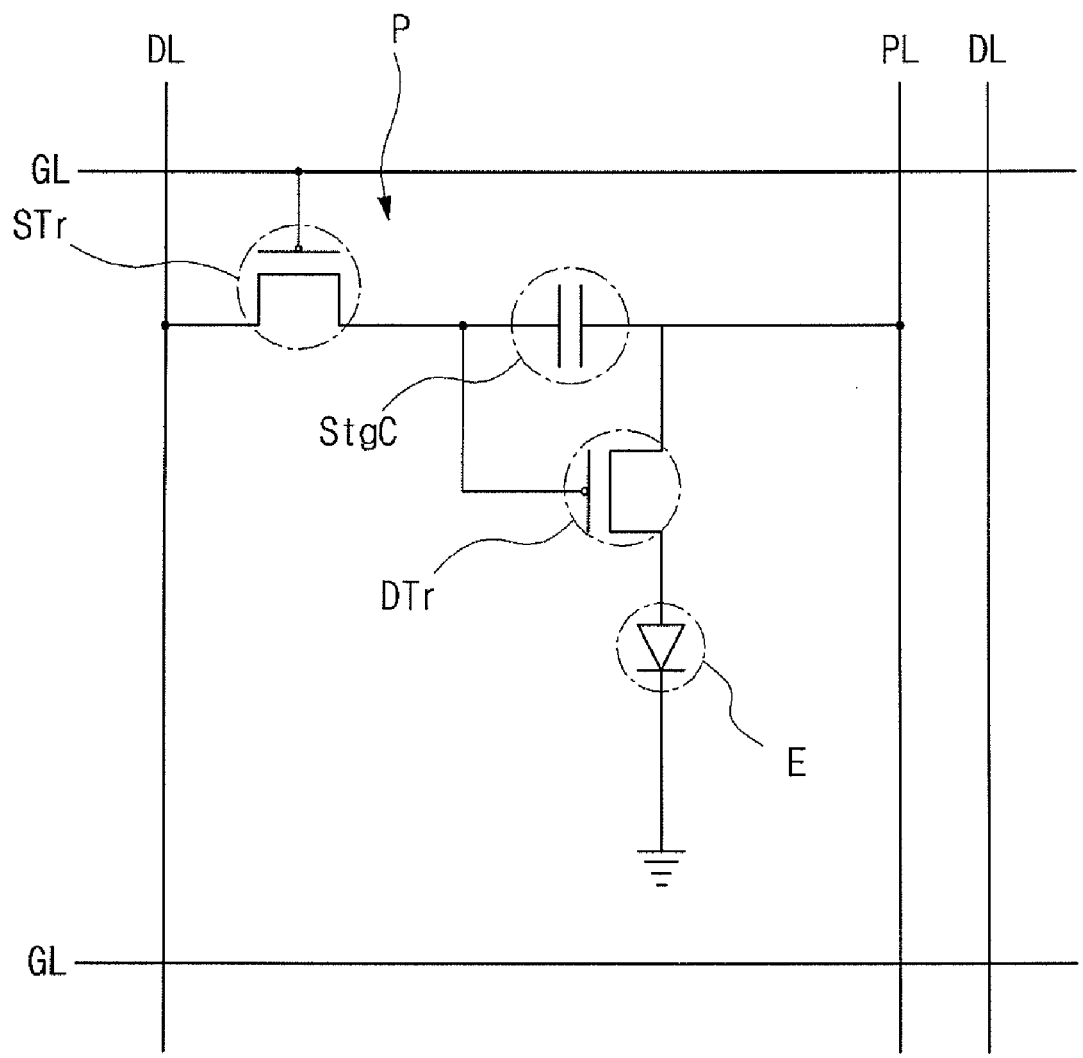
FIG. 1 is a circuit diagram illustrating an OELD device according to the related art.
Figure 2:
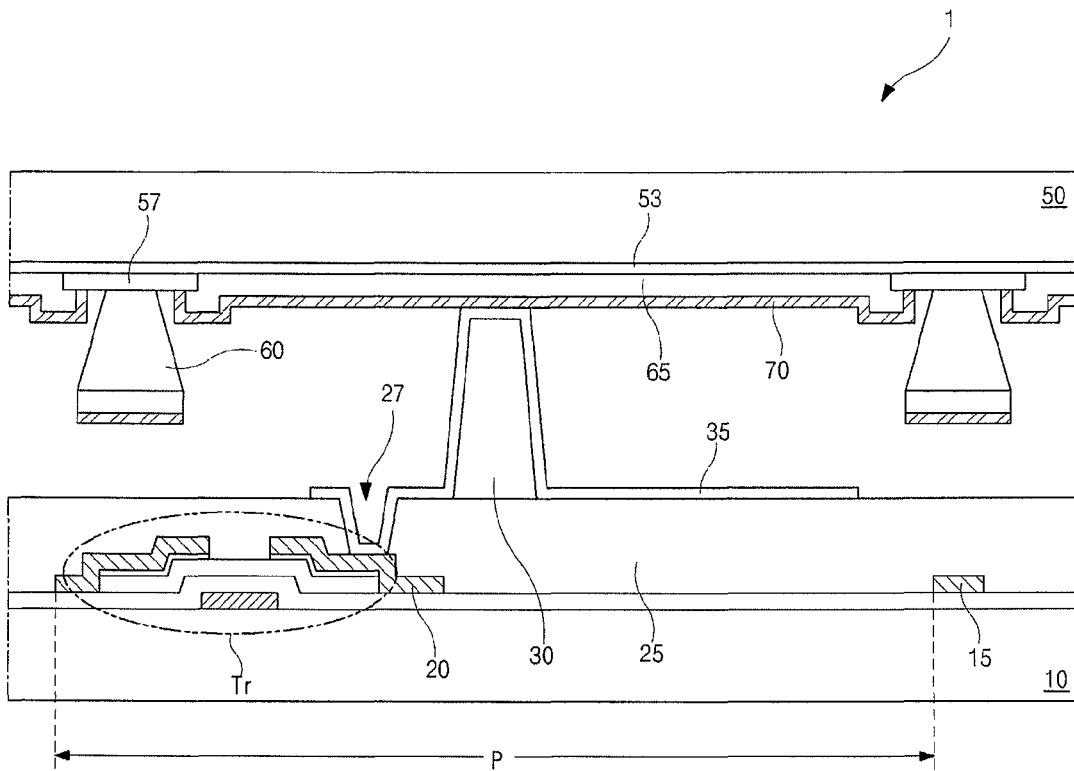
FIG. 2 is a cross-sectional view illustrating a dual panel type OELD device according to the related art.
Figure 3:
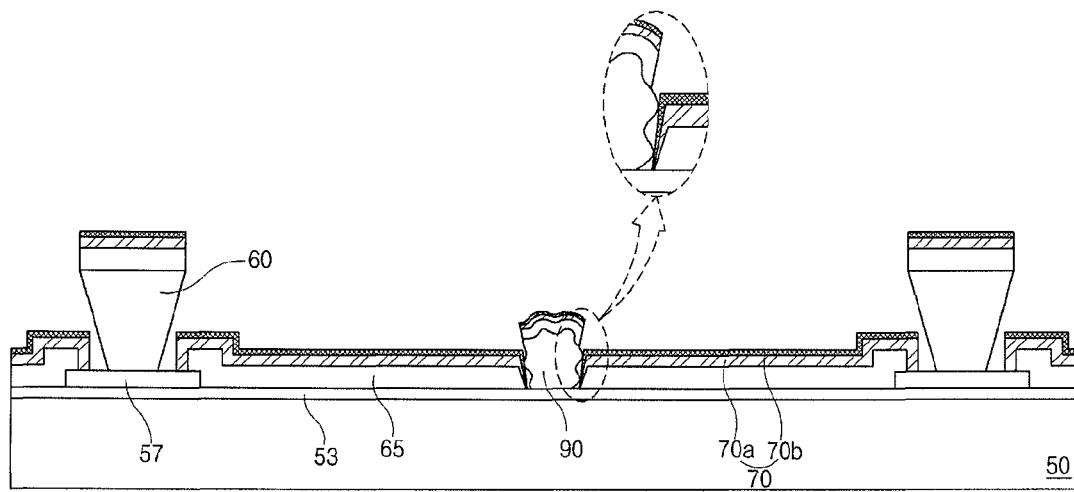
FIG. 3 is a cross-sectional view illustrating the related art OELD device where an alien substance exists.
Figure 4:
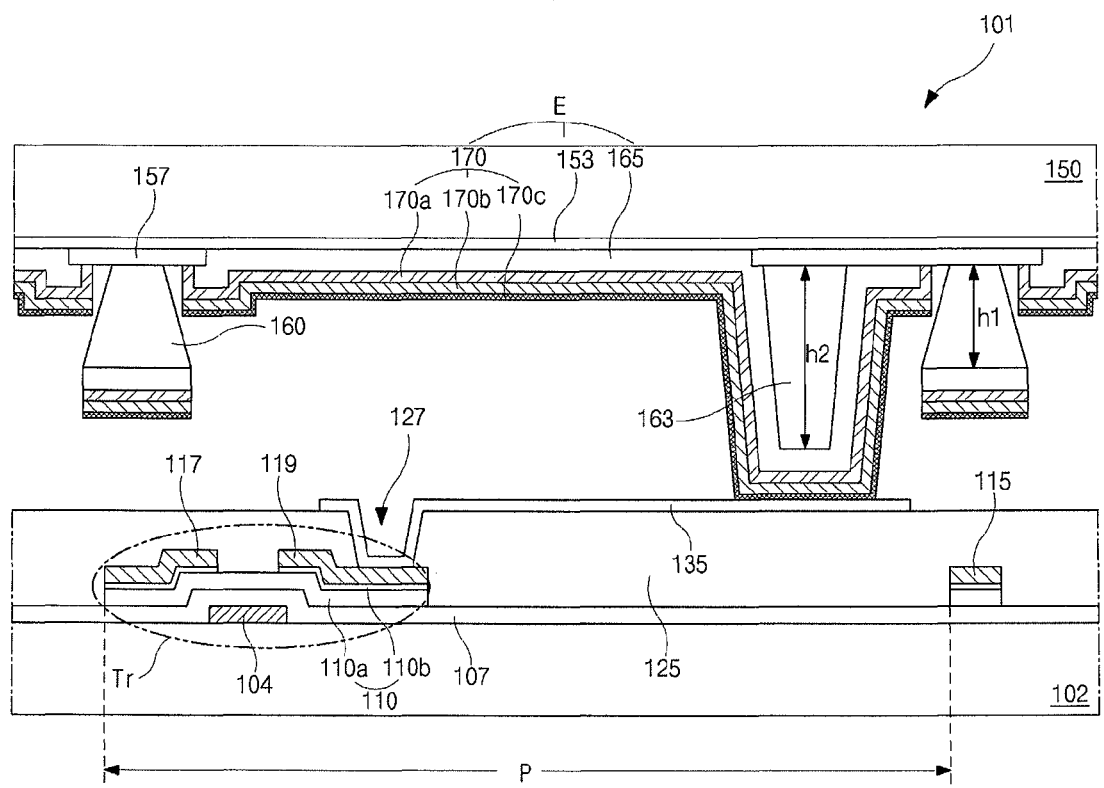
FIG. 4 is a cross-sectional view illustrating an OELD device according to a first embodiment of the present invention.

FIG. 4 is a cross-sectional view illustrating an OELD device according to a first embodiment of the present invention.

Referring to FIG. 4, the dual panel type OELD device 101 includes a lower substrate referred to as an array substrate, and an upper substrate referred to as an opposing substrate or a light emitting diode substrate.

In the array substrate, a gate line (not shown) and a data line 115 are formed on a first substrate 102 and cross each other to define a pixel region P. In the pixel region P, a switching thin film transistor (not shown) and a driving thin film transistor Tr are formed. The driving thin film transistor Tr includes a gate electrode 104, a semiconductor layer 110 on the gate electrode 104, and source and drain electrodes 117 and 119 on the semiconductor layer 110. The semiconductor layer 110 includes an active layer 110a of intrinsic amorphous silicon and an ohmic contact layer 110b of impurity-doped amorphous silicon. A gate insulating layer 107 is on the gate electrode 104 and the gate line. The switching thin film transistor may be a structure similar to the structure of the driving thin film transistor Tr.

A passivation layer 125 is disposed on the switching thin film transistor and the driving thin film transistor Tr. The passivation layer 125 has a contact hole 127 exposing the drain electrode 119. A connection electrode 135 is formed on the passivation layer 125 in the pixel region P and contacts the drain electrode 119 through the contact hole 127. Another passivation layer may be formed on the connection electrode 135 and expose a portion of the connection electrode 135. The connection electrode 135 may be made of the same material as and extend from the drain electrode 119, and the passivation layer 125 may be eliminated.

In the opposing substrate, a first electrode 153 is formed on a second substrate 150. The first electrode 153 may be transparent. The first electrode 153 may be made of a transparent conductive material such as indium-tin-oxide (ITO), indium-zinc-oxide (IZO) and indium-tin-zinc-oxide (ITZO). An auxiliary electrode may be formed on the second substrate 150 and below the first electrode 153 in a peripheral region of the pixel region P.

A buffer pattern 157 may be formed on the first electrode 153 in a peripheral region of the pixel region P. The buffer pattern 157 may be made of silicon oxide ($SiO_2$) or silicon nitride (SiNx). The buffer pattern 157 may cover the auxiliary electrode.

A separator 160 may be formed on the buffer pattern 157. A width of a bottom portion of the separator 160 close to the buffer pattern 157 may be less than a top portion of the separator 160. The separator 160 may have a trapezoidal shape. For example, a width of the separator 160 increases in a direction of the bottom portion to the top portion of the separator 160. The separator 160 may be formed around the pixel region P. The separator 160 may correspond to and overlap the auxiliary electrode.

A patterned spacer 163 may be formed on the buffer pattern 157 and spaced apart from the separator 160. A first height h1 of the separator 160 may be less than a second height h2 of the patterned spacer 163. A width of a bottom portion of the patterned spacer 163 close to the buffer pattern 157 may be more than a top portion of the patterned spacer 163. The patterned spacer 163 may has an inverse trapezoidal shape opposite to the shape of the separator 160. For example, a width of the patterned spacer 163 decreases in a direction of the bottom portion to the top portion of the patterned spacer 163.

An organic light emitting layer 165 is formed on the first electrode 170 in the pixel region P. The organic light emitting layer 165 may cover the patterned spacer 163. A second electrode 170 is formed on the organic light emitting layer 165. The second electrode 170 may cover the patterned spacer 163. The second electrode 170 may be opaque. The second electrode 170 may have a work function less than a work function of the first electrode 153. When the first electrode 153 is transparent and the second electrode 170 is opaque, light emitted from the organic light emitting layer 165 travels toward the second substrate 150.

The second electrode 170 may have a plurality of layers. For example, the second electrode 170 has a triple-layered structure. A first layer 170a at bottom may be made of a low resistance material such as aluminum (Al) and aluminum alloy (AlNd). A second layer 170b at middle may be made of a low resistance material, which is capable of preventing diffusion of calcium (Ca), such as silver (Ag). A third layer 170c at top may be made of a moisture-absorbing material such as calcium (Ca). Accordingly, the second layer 170b can prevent calcium of the third layer 170c from diffusing into the first layer 170a.

An organic light emitting diode E includes the first electrode 153, the organic light emitting layer 163 and the second electrode 170. A portion of the second electrode 170 on the patterned spacer 163 contacts the connection electrode 135. Accordingly, the organic light emitting diode E is electrically connected to the driving thin film transistor Tr.

The patterned spacer 163 functions to electrically connect the organic light emitting diode E and the driving thin film transistor Tr and maintains a cell gap between the array substrate and the opposing substrate. The space between the array substrate and the opposing substrate may be filled with a gas, for example, an inert gas, or a solid material.

The organic light emitting layer 165 may have a plurality of layers. For example, the organic light emitting layer 165 includes a hole transporting layer, a hole injection layer, an organic material layer, an electron injection layer, and an electron transporting layer in a direction from the first electrode 153 to the second electrode 170 when the first and second electrodes 153 and 170 function as an anode and a cathode, respectively.

The separator 160 between the adjacent pixel regions P functions to separate the organic light emitting layers 165 and the second electrodes 170 by the pixel region P due to the shape of the separator 160 when the organic light emitting material and the second electrode material are deposited. The organic light emitting material and the second electrode material may exist on the separator 160.

As described in the first embodiment, the second electrode may include the calcium-diffusion-preventing layer between the calcium layer and the low resistance layer. Accordingly, the moisture can be effectively absorbed, and the calcium can be prevented from diffusing into the low resistance layer.

Figure 5:
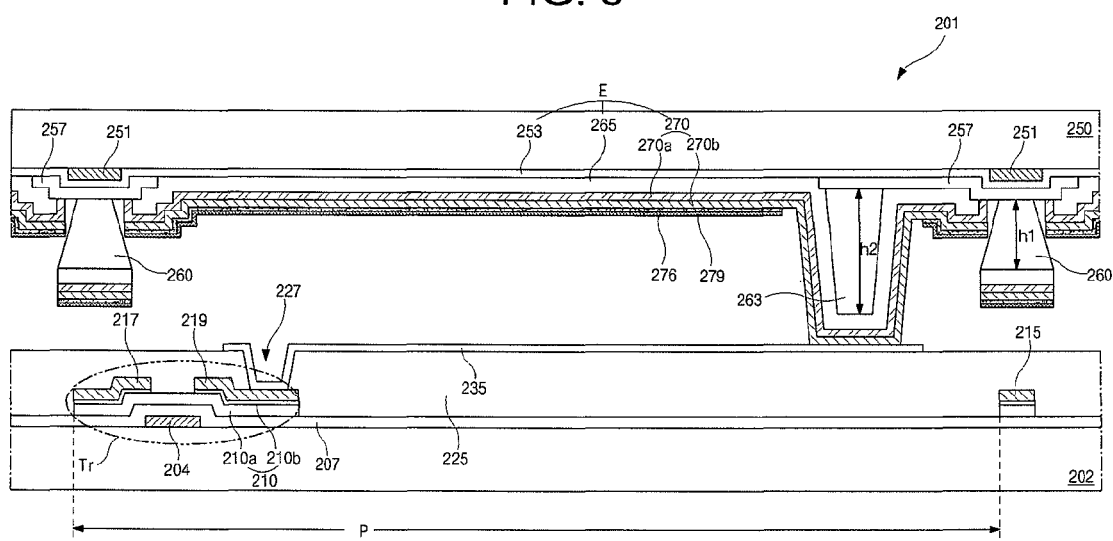
FIG. 5 is a cross-sectional view illustrating an OELD device according to a second embodiment of the present invention.

FIG. 5 is a cross-sectional view illustrating an OELD device according to a second embodiment of the present invention. The OELD device is similar to that of the first embodiment. Accordingly, explanations of parts similar to parts of the first embodiment may be omitted.

Referring to FIG. 5, the dual panel type OELD device 201 includes a lower substrate referred to as an array substrate, and an upper substrate referred to as an opposing substrate or a light emitting diode substrate.

In the array substrate, a gate line (not shown) and a data line 215 are formed on a first substrate 202 and cross each other to define a pixel region P. In the pixel region P, a switching thin film transistor (not shown) and a driving thin film transistor Tr are formed. The driving thin film transistor Tr includes a gate electrode 204, a semiconductor layer 210 on the gate electrode 204, and source and drain electrodes 217 and 219 on the semiconductor layer 210. The semiconductor layer 210 includes an active layer 210a of intrinsic amorphous silicon and an ohmic contact layer 210b of impurity-doped amorphous silicon. A gate insulating layer 207 is disposed on the gate electrode 204 and the gate line. The switching thin film transistor may be a structure similar to the structure of the driving thin film transistor Tr.

A passivation layer 225 is on the switching thin film transistor and the driving thin film transistor Tr. The passivation layer 225 has a contact hole 227 exposing the drain electrode 219. A connection electrode 235 is formed on the passivation layer 225 in the pixel region P and contacts the drain electrode 219 through the contact hole 227. Another passivation layer may be formed on the connection electrode and expose a portion of the connection electrode 235. The connection electrode 235 may be made of the same material as and extend from the drain electrode 219, and the passivation layer 225 may be eliminated.

In the opposing substrate, an auxiliary electrode 251 may be formed on a second substrate 250 in a peripheral region of the pixel region P. A first electrode 253 is formed on the second substrate 250 having the auxiliary electrode 251. The first electrode 253 may be transparent. The first electrode 253 may be made of a transparent conductive material such as indium-tin-oxide (ITO), indium-zinc-oxide (IZO) and indium-tin-zinc-oxide (ITZO). The auxiliary electrode 251 may be made of a low resistance material. When the first electrode 253 is made of the transparent conductive material, such the material may have a high resistance. Accordingly, the auxiliary electrode 251 contacts the first electrode 253 and can assist a voltage to be uniformly applied to the first electrode 253.

A buffer pattern 257 may be formed on the first electrode 253 in the peripheral region of the pixel region P. The buffer pattern 257 may be made of silicon oxide ($SiO_2$) or silicon nitride (SiNx). The buffer pattern 257 may cover the auxiliary electrode 251.

A separator 260 may be formed on the buffer pattern 257. A width of a bottom portion of the separator 260 close to the buffer pattern 257 may be less than a width of a top portion of the separator 260. The separator 260 may have a trapezoidal shape. For example, a width of the separator 260 increases in a direction of the bottom portion to the top portion of the separator 260. The separator 260 may be formed around the pixel region P. The separator 257 may correspond to and overlap the auxiliary electrode 251.

A patterned spacer 263 may be formed on the buffer pattern 257 and spaced apart from the separator 260. A first height h1 of the separator 260 may be less than a second height h2 of the patterned spacer 263. A width of a bottom portion of the patterned spacer 263 close to the buffer pattern 257 may be more than a width of a top portion of the patterned spacer 263. The patterned spacer 263 may has an inverse trapezoidal shape opposite to the shape of the separator 260. For example, a width of the patterned spacer 263 decreases in a direction of the bottom portion to the top portion of the patterned spacer 263.

An organic light emitting layer 265 is formed on the first electrode 270 in the pixel region P. The organic light emitting layer 265 may cover the patterned spacer 263. A second electrode 270 is formed on the organic light emitting layer 265. The second electrode 270 may cover the patterned spacer 263. The second electrode 270 may be opaque. The second electrode 270 may have a work function less than a work function of the first electrode 253. When the first electrode 253 is transparent and the second electrode 270 is opaque, light emitted from the organic light emitting layer 265 travels toward the second substrate 250.

The second electrode 270 may have a plurality of layers. For example, the second electrode 270 has a double-layered structure. A first layer 270a at bottom may be made of a low resistance material such as aluminum (Al) and aluminum alloy (AlNd). A second layer 270b at top may be made of a low resistance material, which is capable of preventing diffusion of calcium (Ca), such as silver (Ag).

A calcium oxide (CaO) layer 276 is formed on the second electrode 270, and a moisture-absorbing layer 279 is formed on the calcium oxide layer 276. The moisture-absorbing layer 279 may be referred to as a getter layer. The moisture-absorbing layer 279 may be made of a moisture-absorbing material such as calcium (Ca).

The calcium oxide layer 276 functions to prevent short-circuit of the first and second electrodes 263 and 270 when an alien substance exists in forming the organic light emitting layer 265. Further, the moisture-absorbing layer 279 absorbs moisture, and the second layer 270b prevents calcium from diffusing into the first layer 270a.

An organic light emitting diode E includes the first electrode 253, the organic light emitting layer 263 and the second electrode 270. A portion of the second electrode 270 on the patterned spacer 263 contacts the connection electrode 235. Accordingly, the organic light emitting diode E is electrically connected to the driving thin film transistor Tr.

The patterned spacer 263 functions to electrically connect the organic light emitting diode E and the driving thin film transistor Tr and maintains a cell gap between the array substrate and the opposing substrate. The space between the array substrate and the opposing substrate may be filled with a gas, for example, an inert gas, or a solid material.

The organic light emitting layer 265 may have a plurality of layers. For example, the organic light emitting layer 265 includes a hole transporting layer, a hole injection layer, an organic material layer, an electron injection layer, and an electron transporting layer in a direction from the first electrode 253 to the second electrode 270 when the first and second electrodes 253 and 270 function as an anode and a cathode, respectively.

The separator 260 between the adjacent pixel regions P functions to separate the organic light emitting layers 265 and the second electrodes 270 by the pixel region P due to the shape of the separator 260 when the organic light emitting material and the second electrode material are deposited. The organic light emitting material and the second electrode material may exist on the separator 260.

The calcium oxide layer 276 and the moisture-absorbing layer 279 may be formed outside a region where the patterned spacer 263 is formed. The calcium oxide material and the moisture-absorbing material may exist on the separator 260.

The second layer 270b has a good adhesion strength for calcium. The second layer 270b may be eliminated since an adhesion strength between the calcium oxide layer and the aluminum layer is more than that between the calcium layer and the aluminum layer and diffusion rate of the calcium oxide into the aluminum layer is relatively low.

FIGS. 6A to 6I are cross-sectional views illustrating a method of manufacturing the opposing substrate of the OELD device according to the second embodiment of the present invention.

Figure 6A:
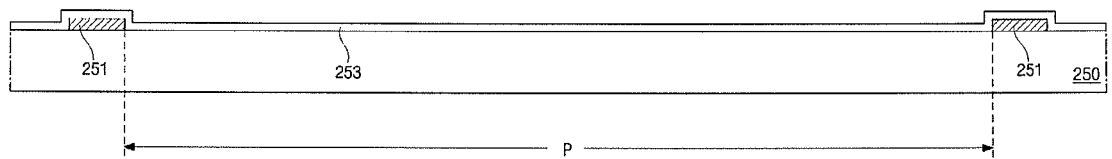
FIGS. 6A to 6I are cross-sectional views illustrating a method of manufacturing the opposing substrate of the OELD device according to the second embodiment of the present invention.

Referring to FIG. 6A, a metallic material is deposited on a substrate 250 and patterned to form an auxiliary electrode 251. The metallic material includes aluminum (Al), aluminum alloy (AlNd), copper (Cu) and copper alloy. A transparent conductive material is deposited on the substrate 250 having the auxiliary electrode to form a first electrode 253. The transparent conductive material includes indium-tin-oxide (ITO), indium-zinc-oxide (IZO) and indium-tin-zinc-oxide (ITZO).

Figure 6B:
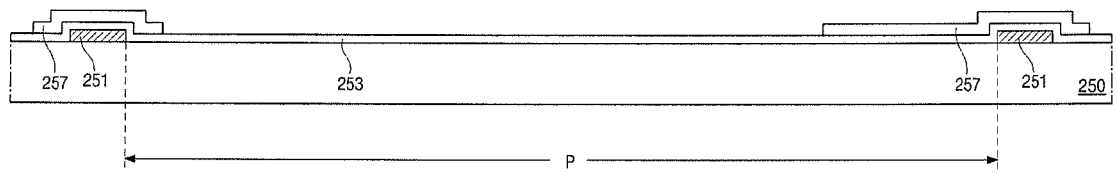

Referring to FIG. 6B, an inorganic insulating material is deposited on the first electrode 253 and patterned to form a buffer pattern 257. The inorganic insulating material includes silicon oxide ($SiO_2$) and silicon nitride ($SiN_x$).

Figure 6C:
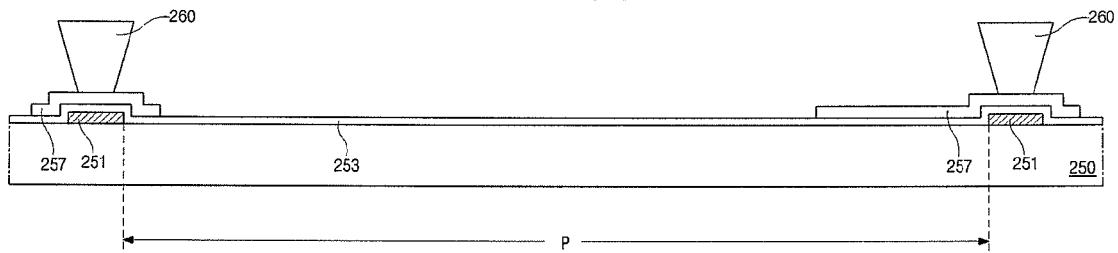

Referring to FIG. 6C, a first organic insulating material is deposited on the substrate 250 having the buffer pattern 257 and patterned to form a separator 260 on the buffer pattern 257. The first organic insulating material may be a photosensitive material, for example, a negative type photosensitive material. The negative type photosensitive material is deposited, exposed to light using a photo mask, and developed. According to a property of the negative type photosensitive material, the separator 260 may have a trapezoidal shape. In other words, due to some factors such as transmissivity of the negative type photosensitive material, amount of light exposure of the negative type photosensitive material decreases in a direction of a top portion to a bottom portion of the negative type photosensitive material. Accordingly, a width of the separator 260 decreases in the direction of the top portion to the bottom portion.

Figure 6D:
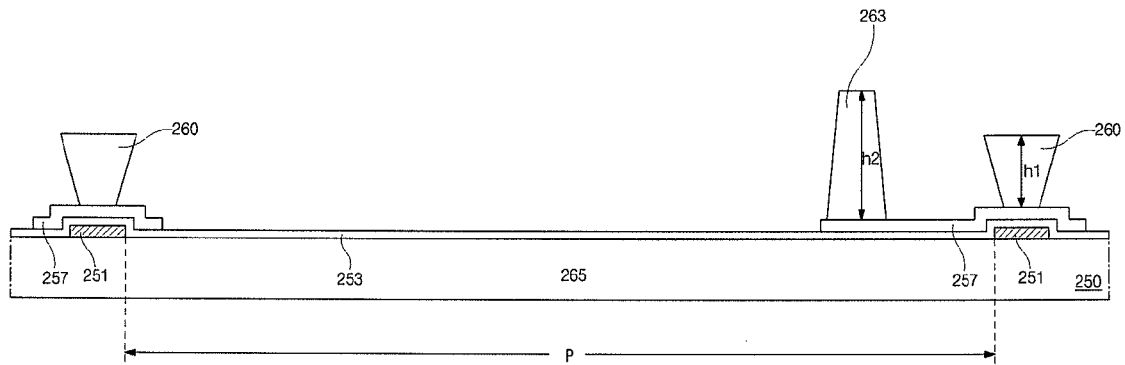

Referring to FIG. 6D, a second organic insulating material is deposited on the substrate 250 having the separator 260 and patterned to form a patterned spacer 263. The second organic insulating material may be a photosensitive material, for example, a positive type photosensitive material. The positive type photosensitive material is deposited, exposed to light using a photo mask, and developed. According to a property of the positive type photosensitive material, the separator 260 may have an inverse trapezoidal shape. A height h2 of the patterned spacer 263 may be more than a height h1 of the separator 260.

Alternatively, the separator 260 and the patterned spacer 263 may be formed in the same mask process.

Figure 6E:
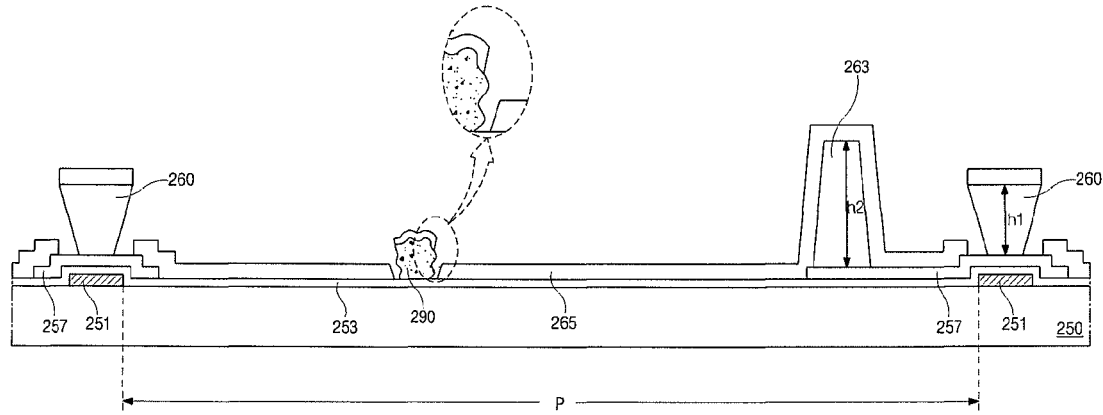

Referring to FIG. 6E, an organic light emitting layer 265 is formed on the first electrode 263 in the pixel region P, for example, by depositing an organic light emitting material using a shadow mask, or by inkjet-coating or nozzle-coating a liquid type organic light emitting material. Red, green and blue organic light emitting layers may be formed in the corresponding pixel regions P. The organic light emitting layer 265 may be separated by the pixel region P due to the separator 260.

Before or in forming the organic light emitting layer 265, indraft of an alien substance 290 is caused, and the alien substance 290 exists on the first electrode 253. When the alien substance 290 exists, the organic light emitting layer 265 may not be formed around the alien substance 290. When the alien substance 290 does not exist, the organic light emitting layer 265 is normally formed on the first electrode 253 and substantially flat.

Figure 6F:
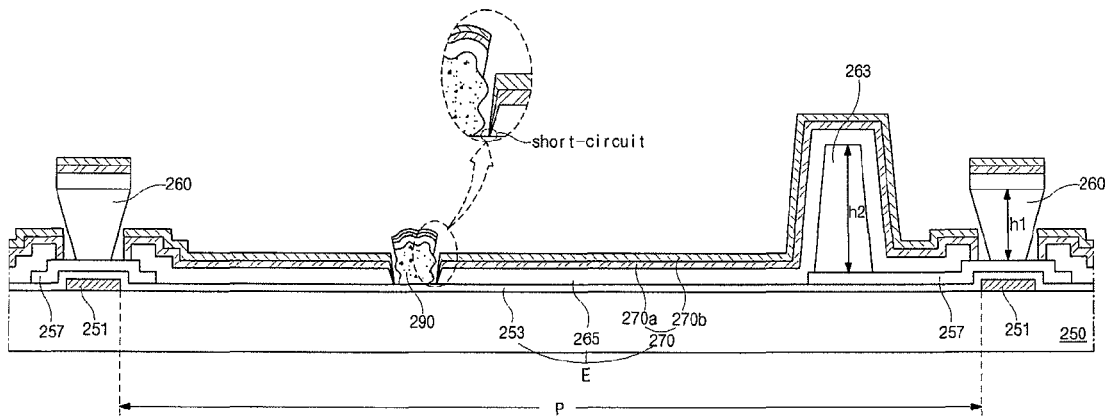

Referring to FIG. 6F, a metallic material, for example, aluminum or aluminum alloy is deposited on the organic light emitting layer 265 to form a first layer 270a of a second electrode 270. Then, a metallic material, for example, silver is deposited on the first layer 270a to form a second layer 270b of the second electrode 270. The second electrode 270 may be separated by the pixel region P due to the separator 260. An organic light emitting diode E includes the first electrode 253, the organic light emitting layer 265 and the second electrode 270.

At least one of the first or second layers 270a or 270b may be formed even along sides of the organic light emitting layer 265 around the alien substance 290 and contact the first electrode 253. A portion of the second electrode 270 on the sides of the organic light emitting layer 265 may be much thinner than other portion of the second electrode 270. For example, the portion of the second electrode 270 around the alien substance 290 may have a thickness of about several ten Å.

Figure 6G:
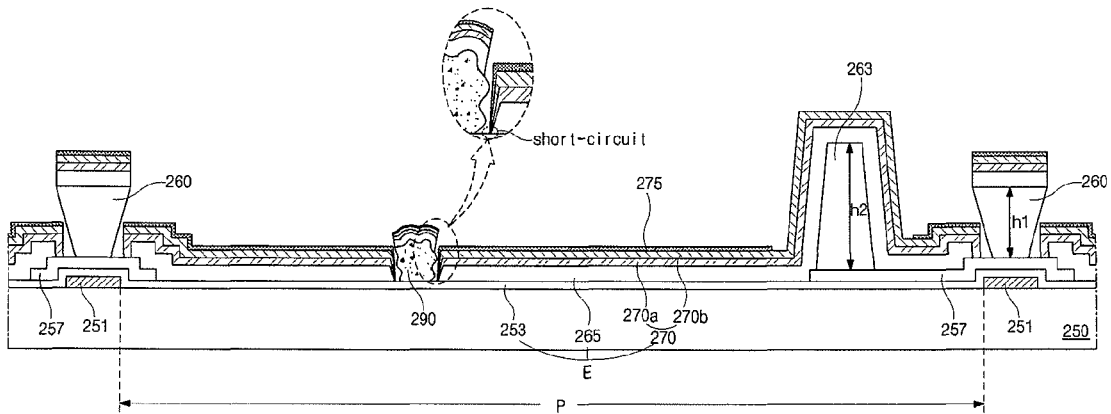

Referring to FIG. 6G, a material having a moisture-absorbing property, for example, calcium is deposited on the second electrode 270 using a shadow mask to form a temporary calcium layer 275. The temporary calcium layer 275 may have a thickness of about 50 Å to about 200 Å. The temporary calcium layer 275 may not be formed on the patterned spacer 263 by using the shadow mask. The temporary calcium layer 275 becomes an insulating layer in a subsequent process. Accordingly, when the temporary calcium layer 275 is formed on the patterned spacer 263, the second electrode 270 is not electrically connected to the driving thin film transistor (Tr of FIG. 5). Accordingly, the temporary calcium layer 275 is formed outside the contacting region of the second electrode and the connection electrode (265 of FIG. 5).

The temporary calcium layer 275 may cover the portion of the second electrode 270 around the alien substance 290. This structure may be achieved by adequately adjusting conditions in a chamber for forming the temporary calcium layer 275. For example, in a state that a stage, on which the substrate 250 is placed, is rotated at a predetermined angle and a calcium target is not parallel to the substrate 50, the calcium depositing process is performed. Accordingly, the temporary calcium layer 275 is formed to even cover the portion of the second electrode 270 around the alien substance 290.

Figure 6H:
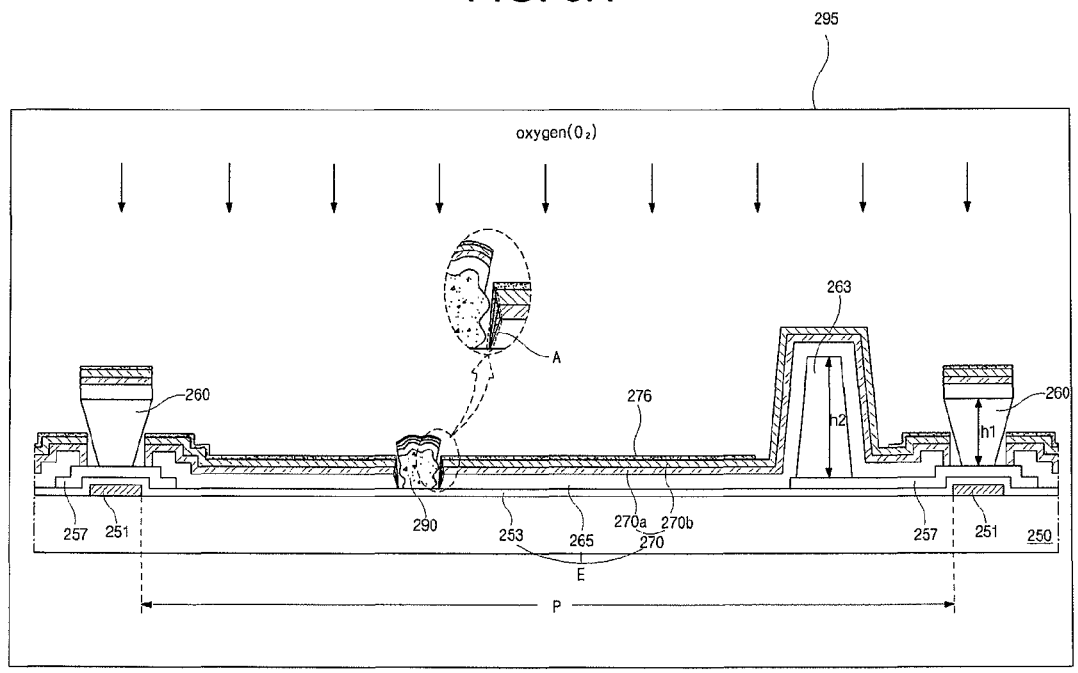

Referring to FIG. 6H, the temporary calcium layer (275 of FIG. 6G) is exposed to oxygen ($O_2$) gas during a predetermined time under vacuum condition to form a calcium oxide layer 276. The portion A of the second electrode 270 around the alien substance 290 is very thin, about several ten Å. While the temporary calcium layer is changed into the calcium oxide layer 276, the calcium oxide diffuses in a range of about several tens Å to several hundreds Å into the second electrode 270. The portion A, which contacts the first electrode 253 and has the thickness of several ten Å, of the second electrode 270 around the alien substance 290 has an insulating property due to the diffusion of the calcium oxide, and thus the short-circuit of the first and second electrodes 253 and 270 is canceled and insulated from each other.

In more detail, the oxidization process is performed in short time by placing the temporary calcium layer in a vacuum chamber 295, injecting the oxygen gas, raising a temperature, for example, at about 100 degrees to about 300 degrees Celsius (° C.). Under this high temperature condition, the calcium oxide layer diffuses in a range of about several tens Å to several hundreds Å into the second electrode 270. Other portion of each of the first and second layers 270a and 270b of the second electrode 270 except for the portion A of the second electrode 270 around the alien substance 290 has a thickness of about several thousands Å. However, the portion A of the second electrode 270 around the alien substance 290 has the thickness of about several tens Å since the alien substance 290 causes the second electrode 270 not to be normally formed around the alien substance 290. Accordingly, the calcium oxide diffuses into substantially all of the portion A of the second electrode 270 around the alien substance 290, and the portion A has the insulating property. Therefore, even though the first and second electrodes 253 and 270 contacts each other around the alien substance 290, since the portion A is changed into an insulating portion, the first and second electrodes 253 and 270 are electrically insulated around the alien substance 290 and the short-circuit therebetween is prevented.

The oxidation process may be performed under atmospheric condition. However, under this condition, the calcium oxide hardly diffuses into the second electrode 270, and the short-circuit of the first and second electrodes 253 and 270 still remains. It takes long time to oxidize the temporary calcium layer when using oxygen gas under the atmospheric condition. Further, before the calcium is changed into the calcium oxide, the calcium absorbs moisture in the atmosphere, and even though a moisture-absorbing layer, for example, made of calcium is formed in a subsequent process, moisture-absorbing capability is reduced. Accordingly, it is preferred that the oxidation process is performed under the vacuum condition at a predetermined temperature.

Figure 6I:
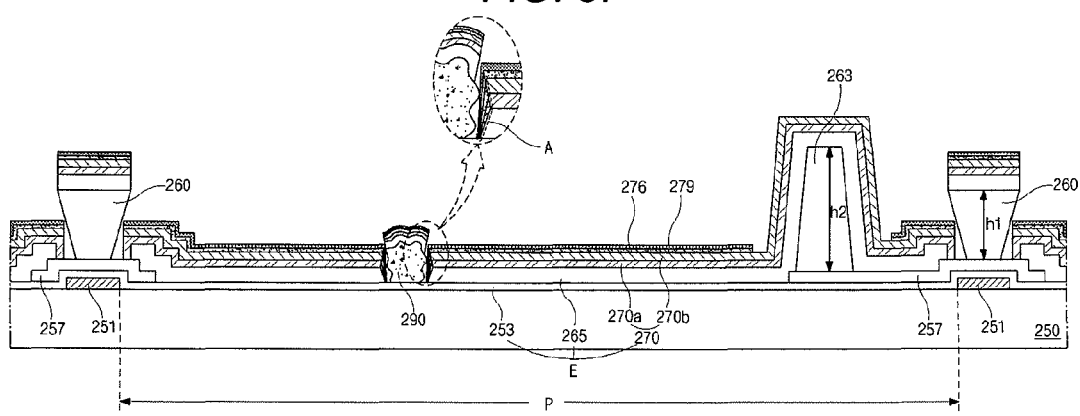

Referring to FIG. 6I, the moisture-absorbing layer 279 may be formed under a vacuum condition on the calcium oxide layer 276. The moisture-absorbing layer 279 may be made of calcium. The moisture-absorbing layer 279 may not be formed on the patterned spacer 263 using a shadow mask, in a manner similar to forming the temporary calcium layer (275 of FIG. 6G). Alternatively, the moisture-absorbing layer 279 may be deposited on the entire surface of the substrate 250 and separated by the separator 260.

It is preferred that the moisture-absorbing layer 279 is not formed on the patterned spacer 263. Further, the moisture-absorbing layer 279 may contact the calcium oxide layer 276 and not contact the second electrode 270. Even though the portion A of the second electrode 270 around the alien substance 290 is insulated, the moisture-absorbing layer 279 may be formed along the portion A of the second electrode 270 and contact the first electrode 253. In this state, when the moisture-absorbing layer 279 contacts the second electrode 270, the first electrode 253 is electrically connected to the second electrode 270 through the moisture-absorbing layer 279. To prevent this, it is preferred that the moisture-absorbing layer 279 is electrically insulated from and does not contact the second electrode 270. In other words, the calcium oxide layer 276 may be interposed between the moisture-absorbing layer 279 and the second electrode 270, and insulate the both form each other.

Through the aforementioned processes, the opposing substrate of the OELD device is manufactured.

Referring to FIG. 5, the array substrate may be formed as follows. The gate line and the gate electrode 204 are formed on the first substrate 202. The gate insulating layer 207 is formed on the gate line and the gate electrode 204. The semiconductor layer 210 including the active layer 210a and the ohmic contact layer 210b is formed on the gate insulating layer 207 over the gate electrode 204. The data line 215 and the source and drain electrodes 217 and 219 are formed. The data line 215 is on the gate insulating layer 207, and the source and drain electrodes 217 and 219 are on the semiconductor layer 210. The semiconductor layer 210, the source and drain electrodes 217 and 219 and the data line 215 may be formed in the same mask process. The passivation layer 225 is formed on the data line 215 and the source and drain electrodes 217 and 219. The passivation layer 225 includes the contact hole 227. The connection electrode 235 is formed on the passivation layer 225. The connection electrode 235 contacts the drain electrode 219 through the contact hole 227. Through the aforementioned processes, the array substrate of the OELD device 201 is manufactured.

The array substrate and the opposing substrate are attached using a seal pattern in peripheral regions of the array substrate and the opposing substrate. Before the attaching process, the seal pattern may be formed on the peripheral region of one of the array substrate and the opposing substrate. The attaching process may be performed under a vacuum condition or a condition using an inert gas, for example, nitrogen ($N_2$) gas. In the attaching process, the patterned spacer 263 is arranged to correspond to the connection electrode 235 such that the second electrode 270 on the patterned spacer 263 contacts the connection electrode 235. Though the aforementioned processes, the OELD device 201 is manufactured.

In the second embodiment, the calcium layer is oxidized into calcium oxide layer having the insulating property. Accordingly, even though the alien substance exists on the first electrode and the first and second electrodes contact each other around the alien substance, the calcium oxide diffuses into the thin portion of the second electrode around the alien substance during the oxidization process, and the portion of the second electrode around the alien substance is changed into the insulating portion. Accordingly, the short-circuit of the first and second electrodes around the alien substance can be prevented. Therefore, display quality and production efficiency can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method of manufacturing an organic electroluminescent display device, comprising:
   forming a first electrode on a first substrate including a plurality of pixel regions;
   forming a patterned spacer on the first electrode in the pixel region;
   forming an organic light emitting layer on the first electrode in the pixel region and on the patterned spacer;
   forming a second electrode on the organic light emitting layer;
   forming a calcium layer on the second electrode, and covered by the second electrode;
   forming a calcium oxide layer on the second electrode by exposing the calcium layer to oxygen gas, wherein a calcium oxide of the calcium oxide layer diffuses into a portion of the second electrode such that the portion of the second electrode has an insulating property;
   forming a moisture-absorbing layer on the calcium oxide layer;
   forming a driving thin film transistor on a second substrate; and
   forming a connection electrode connected to the driving thin film transistor, the connection electrode contacting the second electrode on the patterned spacer.

2. The method according to claim 1, wherein the calcium oxide layer and the moisture-absorbing layer are outside a contacting region of the second electrode and the connection electrode.

3. The method according to claim 1, further comprising forming a separator between the adjacent pixel regions and having a shape such that a width of a bottom portion of the separator close to the first electrode is less than a width of a top portion of the separator, wherein the separator separates the organic light emitting layers and the second electrodes of the adjacent pixel regions.

4. The method according to claim 1, wherein forming the calcium oxide layer includes:
   forming a calcium layer on the second electrode; and
   oxidizing the calcium layer using an oxygen gas at a predetermined temperature.

5. The method according to claim 4, wherein the predetermined temperature is about 100 degrees to about 300 degrees Celsius, and the calcium layer is oxidized under vacuum.

6. The method according to claim 1, wherein the moisture-absorbing layer is made of calcium.

7. The method according to claim 6, wherein the moisture-absorbing layer is insulated from the second electrode by the calcium oxide layer.

8. The method according to claim 6, wherein forming the second electrode includes:
   forming a first layer on the organic light emitting layer; and
   forming a second layer on the first layer, the second layer made of silver.

9. The method according to claim 8, wherein the first layer is made of one of aluminum or aluminum alloy.

10. The method according to claim 3, further comprising forming a buffer pattern between the first electrode, and the patterned spacer and the separator.

11. The method according to claim 10, further comprising forming an auxiliary electrode between the first substrate and the first electrode and corresponding to the buffer pattern.

12. An organic electroluminescent display device, comprising:
   a first electrode on a first substrate including a plurality of pixel regions;
   a patterned spacer on the first electrode in the pixel region;
   an organic light emitting layer on the first electrode in the pixel region and on the patterned spacer;
   a second electrode on the organic light emitting layer;
   a calcium oxide layer on the second electrode, wherein a calcium oxide of the calcium oxide layer diffuses into a portion of the second electrode such that the portion of the second electrode has an insulating property;
   a moisture-absorbing layer on the calcium oxide layer;
   a driving thin film transistor on a second substrate; and
   a connection electrode connected to the driving thin film transistor, the connection electrode contacting the second electrode on the patterned spacer.

13. The device according to claim 12, wherein the calcium oxide layer and the moisture-absorbing layer is outside a contacting region of the second electrode and the connection electrode.

14. The device according to claim 12, further comprising a separator between the adjacent pixel regions and having a shape such that a width of a bottom portion of the separator close to the first electrode is less than a width of a top portion of the separator, wherein the separator separates the organic light emitting layers and the second electrodes of the adjacent pixel regions.

15. The device according to claim 12, wherein the moisture-absorbing layer is made of calcium.

16. The device according to claim 15, wherein the moisture-absorbing layer is insulated from the second electrode by the calcium oxide layer.

17. The device according to claim 15, wherein the second electrode includes a first layer on the organic light emitting layer, and a second layer on the first layer, the second layer made of silver.

18. The device according to claim 17, wherein the first layer is made of one of aluminum or aluminum alloy.

19. The device according to claim 14, further comprising a buffer pattern between the first electrode, and the patterned spacer and the separator.

20. The device according to claim 19, further comprising an auxiliary electrode between the first substrate and the first electrode and corresponding to the buffer pattern.

* * * * *